US009865287B2

(12) United States Patent
Tanabe et al.

(10) Patent No.: US 9,865,287 B2
(45) Date of Patent: Jan. 9, 2018

(54) SUSPENSION BOARD WITH CIRCUIT AND PRODUCING METHOD THEREOF

(71) Applicant: NITTO DENKO CORPORATION, Osaka (JP)

(72) Inventors: Hiroyuki Tanabe, Osaka (JP); Yuu Sugimoto, Osaka (JP); Yoshito Fujimura, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 15/059,850

(22) Filed: Mar. 3, 2016

(65) Prior Publication Data
US 2016/0270229 A1 Sep. 15, 2016

(30) Foreign Application Priority Data
Mar. 12, 2015 (JP) .................. 2015-049039

(51) Int. Cl.
*G11B 5/48* (2006.01)
*H05K 1/18* (2006.01)
*H05K 1/05* (2006.01)

(52) U.S. Cl.
CPC ............ *G11B 5/4833* (2013.01); *G11B 5/484* (2013.01); *G11B 5/4853* (2013.01); *H05K 1/184* (2013.01); *H05K 1/056* (2013.01)

(58) Field of Classification Search
CPC ........ H05K 1/115; H05K 3/10; H05K 3/4038; H05K 1/184; H05K 1/056; H05K 1/11;
(Continued)

(56) References Cited

U.S. PATENT DOCUMENTS 8,587,904 B2 * 11/2013 Ohsawa ............... G11B 5/4853
360/244.1
2010/0110649 A1 * 5/2010 Ohsawa .................. G11B 5/486
361/760
(Continued)

FOREIGN PATENT DOCUMENTS

| JP | 2010-108575 A | 5/2010 |
| JP | 2012-104210 A | 5/2012 |
| JP | 2012-119032 A | 6/2012 |

*Primary Examiner* — Michael F McAllister
(74) *Attorney, Agent, or Firm* — Edwards Neils LLC; Jean C. Edwards, Esq.

(57) ABSTRACT

A suspension board with circuit includes a first layer made of a metal supporting board, a second layer having insulating properties and provided at one side in a thickness direction of the first layer, and a third layer provided at one side in the thickness direction of the second layer and made of copper or a copper alloy. The first layer includes a first opening portion passing through in the thickness direction. The first opening portion is provided with a conductor layer that is, when projected in a direction orthogonal to the thickness direction, overlapped with the first layer. The conductor layer includes a first conductor circuit having a first electronic component-connecting terminal for being electrically connected to a first electronic component and made of copper or a copper alloy. The third layer includes a second conductor circuit having a second electronic component-connecting terminal for being electrically connected to a second electronic component.

5 Claims, 8 Drawing Sheets

(58) Field of Classification Search
CPC ........ H05K 3/40; G11B 5/4833; G11B 5/484; G11B 5/4853; G11B 5/48
USPC .................................................. 174/250, 260
See application file for complete search history.

(56) References Cited

U.S. PATENT DOCUMENTS

| | | | |
|---|---|---|---|
| 2012/0048609 A1* | 3/2012 | Ohnuki | G11B 5/486 174/260 |
| 2012/0092794 A1* | 4/2012 | Ohsawa | G11B 5/486 360/246.2 |
| 2012/0134056 A1* | 5/2012 | Yamada | G11B 5/4833 360/245.9 |
| 2012/0175151 A1* | 7/2012 | Mizutani | G11B 5/4853 174/250 |
| 2013/0020112 A1* | 1/2013 | Ohsawa | G11B 5/486 174/255 |

* cited by examiner

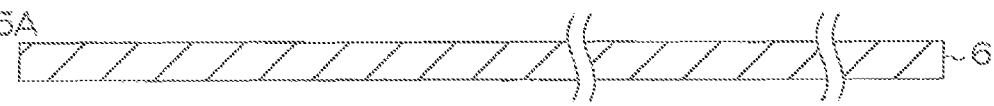
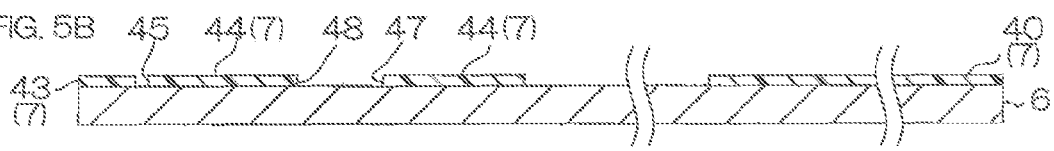
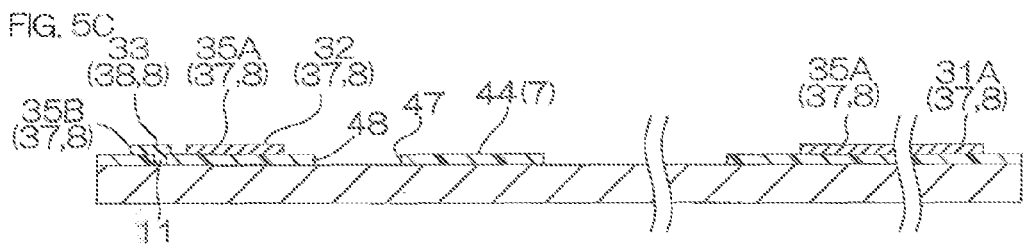
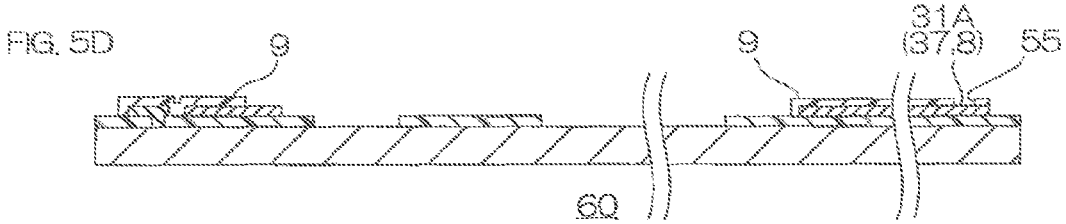
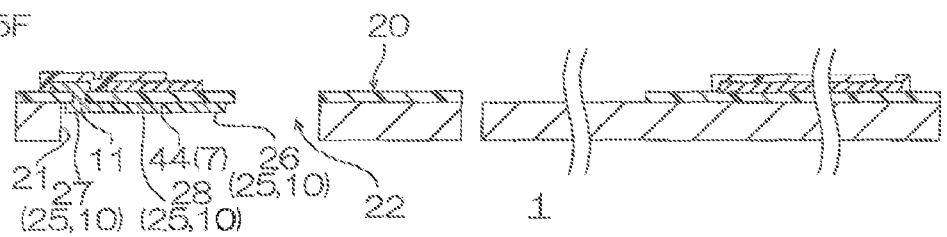
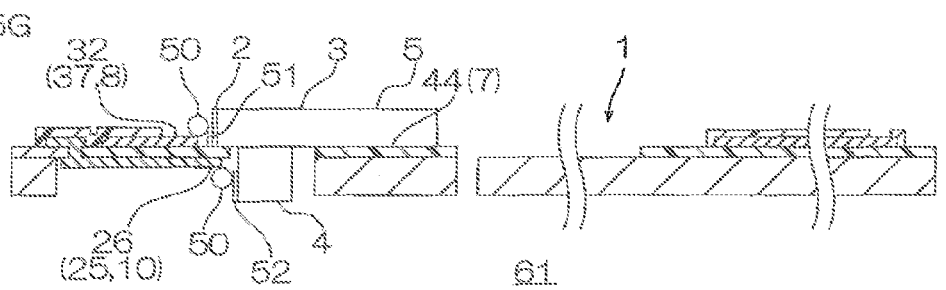

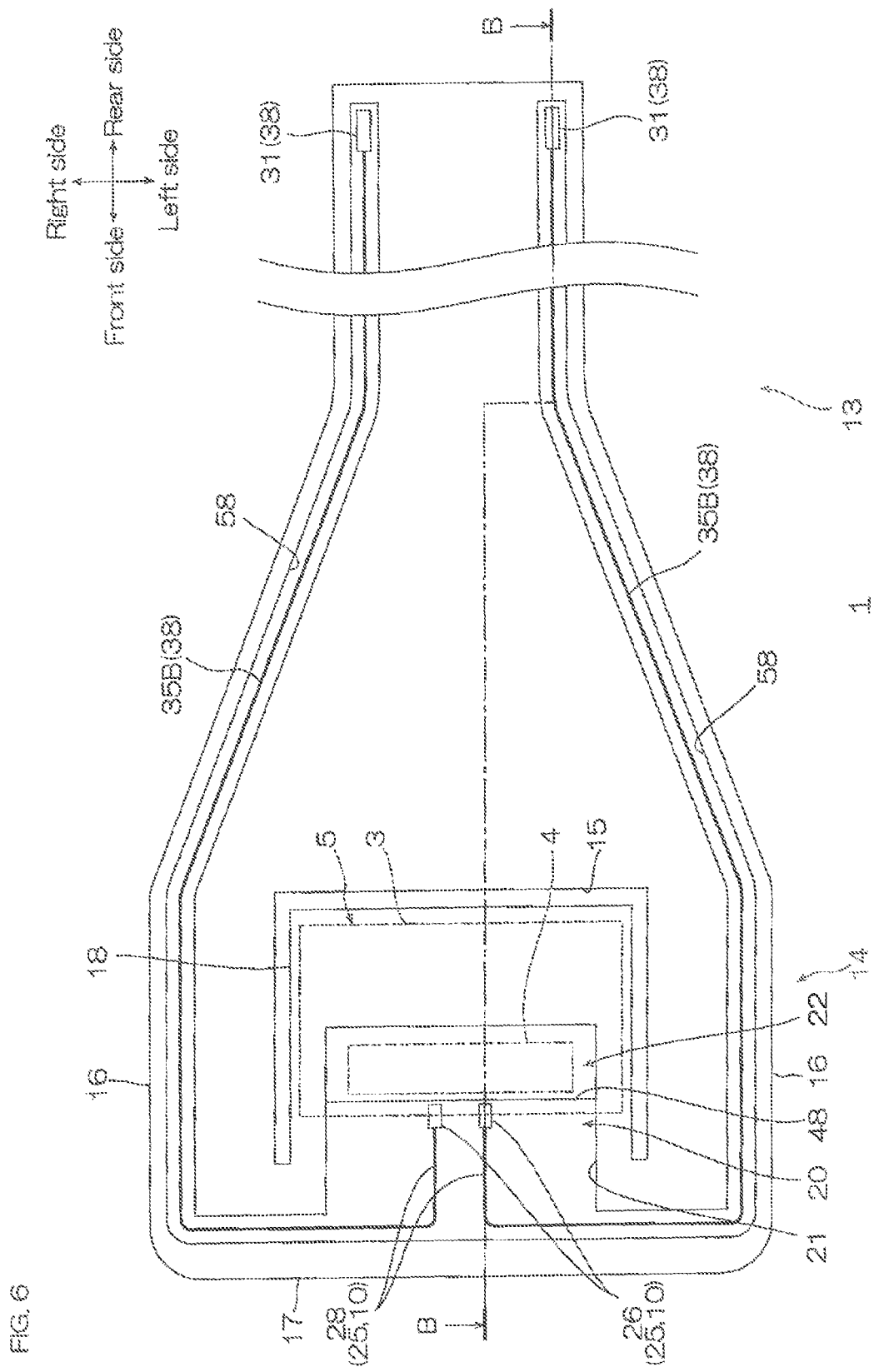

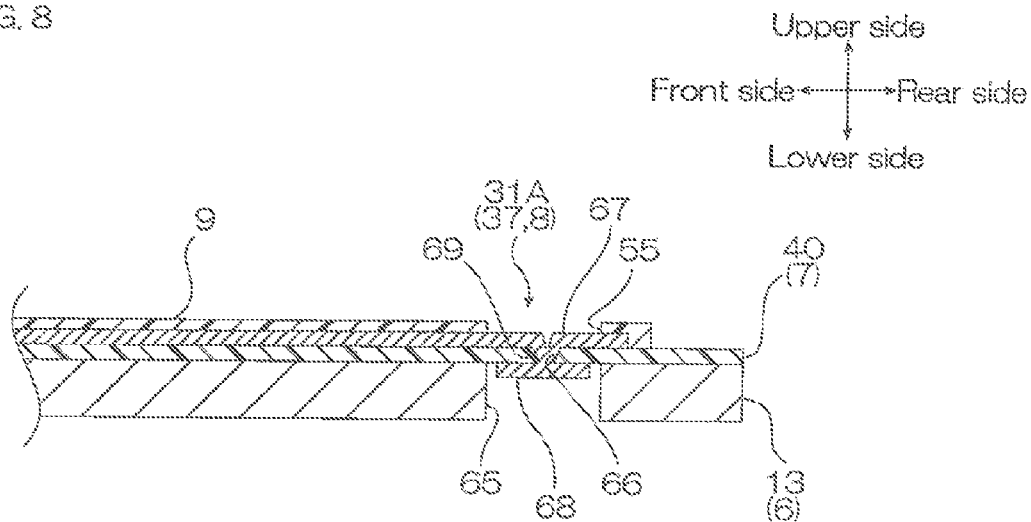
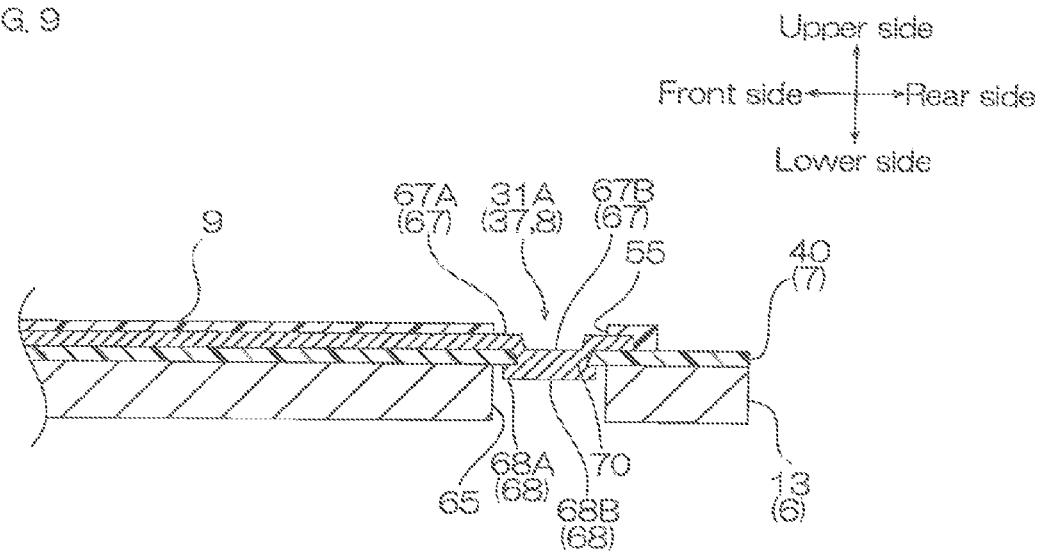

SUSPENSION BOARD WITH CIRCUIT AND PRODUCING METHOD THEREOF

CROSS-REFERENCE TO RELATED APPLICATION

The present application claims priority from Japanese Patent Application No, 2015-049039 filed on Mar. 12, 2015, the contents of which are hereby incorporated by reference into this application.

BACKGROUND OF THE INVENTION

Field of the Invention

The present invention relates to a suspension board with circuit and a producing method thereof, to be specific, to a suspension board with circuit used in a hard disk drive and a producing method thereof.

Description of Related Art

As a suspension board with circuit, a suspension board with circuit in which a slider including a magnetic head is provided in a gimbal portion to be mounted on a hard disk drive has been, conventionally known.

In such a suspension board with circuit, it has been proposed feat a heat assist device including a light emitting element such as a laser diode is further mounted so as to increase the memory capacity of a disk (ref: for example, Japanese Unexamined Patent Publications No. 2010-108575 and No. 2012-104210).

Japanese Unexamined Patent Publication No. 2010-108575 discloses a suspension board with circuit including a first terminal provided on the front face of the suspension board with circuit and electrically connected with a magnetic head and a second terminal provided on the back face of the suspension board with circuit and electrically connected with an electronic device.

Japanese Unexamined Patent Publication No. 2012-104210 discloses a suspension board with circuit including a metal support substrate, a first insulating layer, a second insulating layer, a first conductor pattern, and a second conductor pattern and in which the first conductor pattern includes a first communicating portion formed ok the first insulating layer and below the second insulating layer and a first terminal electrically connected to an electronic element, and the second conductor pattern includes a second communicating portion formed on the second insulating layer and a second terminal electrically connected to a magnetic head.

In such a suspension board with circuit, two layers of conductor layers including terminals are laminated in a thickness direction (upper surface and/or lower surface) of the metal supporting board, so that there is a disadvantage that the number of layers is large and thus, the thinning thereof is difficult.

A disk drive flexure including a metal base, an insulating layer formed on the metal base, a conductor formed on the insulating layer and electrically connected to an attached electronic unit, an electrical circuit portion formed on a part of the metal base and connected to a terminal portion of the attached electronic unit, and a conductor coupling portion formed to pierce the insulating layer in a thickness direction and electrically coupling the electrical circuit portion with the conductor is proposed (ref: for example, Japanese Unexamined Patent Publication No. 2012-119032).

In the disk drive flexure described in Japanese Unexamined Patent Publication No. 2012-119032, by etching the metal base, the metal base serves as the electrical circuit portion, so that the thinning thereof is possible.

SUMMARY OF THE INVENTION

However, the metal base is required to be processed, so that there is a disadvantage that, the miniaturization of the electrical circuit portion is difficult.

The metal base is generally made of a stainless steel board or the like, so that there is a disadvantage that it has higher electric resistance than a conductor material such as a copper wire.

It is an object of the present invention to provide a suspension board with circuit that is capable of achieving the thinning thereof and has excellent miniaturization and excellent electrically conductive properties, and a producing method thereof.

The present Invention [1] includes a suspension board with circuit including a first layer made of a metal supporting board, a second layer having insulating properties and provided at one side in a thickness direction of the first layer, and a third layer having electrically conductive properties, provided at one side in the thickness direction of the second, layer, and made of copper or a copper alloy, wherein the first layer includes a first opening portion passing through in the thickness direction; the first opening portion is provided with a conductor layer that is, when projected in a direction orthogonal to the thickness direction, overlapped with the first layer; the conductor layer includes a first conductor circuit having a first electronic component-connecting terminal for being electrically connected to a first electronic component and made of copper or a copper alloy; and the third layer includes a second conductor circuit laving a second electronic component-connecting terminal for being electrically connected to a second electronic component.

According to the suspension board with circuit, the first conductor circuit having the first electronic component-connecting terminal is provided in the first opening portion of the metal supporting hoard so as to be overlapped with the metal supporting board, when projected in the direction orthogonal to the thickness direction. Thus, the thinning of the suspension board with circuit can be achieved.

Furthermore, the first conductor circuit is provided not from the metal supporting board, but from the conductor layer made of copper or a copper alloy, so that the electrically conductive properties are excellent. Also, the conductor layer is provided by a known formation method of a wire pattern such as an additive method, so that the miniaturization is possible.

The present invention [2] includes, in the suspension board with circuit described in [1], the third layer further including a third conductor circuit, the second layer including a second opening portion passing through in the thickness direction so as to be overlapped with the first opening portion, when projected in the thickness direction, and the second opening portion being provided with, a connecting portion electrically connecting the first conductor circuit to the third conductor circuit.

According to the suspension hoard with circuit the third layer includes the second conductor circuit and the third conductor circuit, and the first conductor circuit Is electrically connected to the third conductor circuit via the connecting portion. Thus, the third conductor circuit that is electrically connected to the first conductor circuit can be provided at the one side in the thickness direction of tire first layer, so that the area of the first conductor circuit that is provided at the other side in the thickness direction of the first layer can be reduced. Therefore, the area of the first opening portion that is provided in the first layer made of the metal supporting hoard can be reduced, so that the strength of the first layer and accordingly, the strength of the suspension board with circuit are excellent. Also, the production efficiency is excellent.

The present invention [3] includes a method for producing a suspension board with circuit including the steps of preparing an intermediate member including a first layer made of a metal supporting board, a second layer having insulating properties and provided at one side in a thickness direction of the first layer, and a third, layer provided at one side in the thickness direction of the second layer and made of copper or a copper alloy; providing a first opening portion passing through in the thickness direction in the first layer; and providing a first conductor circuit having a first electronic component-connecting terminal for being electrically connected to a first electronic component and made of copper or a copper alloy at a surface at the other side in fee thickness direction of the second layer in the first opening portion.

According to the method for producing a suspension board with circuit, the first conductor circuit having the first electronic component-connecting terminal can be provided in the first opening portion of the metal supporting board so as to be overlapped with the metal supporting board, when projected in the direction orthogonal to the thickness direction.

Thus, the first conductor circuit is not laminated in tire thickness direction of the metal supporting board, so that the thinning of the suspension board with circuit can be achieved.

Furthermore, the first, conductor circuit is provided not from the metal supporting board, but from the conductor layer made of copper or a copper alloy, so that the electrically conductive properties are excellent. Also, the conductor layer can be provided by a known formation method of a wire pattern such as an additive method, so that the miniaturization is possible.

The present invention [4] includes, in the method for producing a suspension board with circuit described in [3], in the intermediate member, the third layer further including a third conductor circuit, and the second layer including a second opening portion passing through in the thickness direction, the second opening portion being provided with a connecting portion electrically connecting the first conductor circuit to the third conductor circuit and in the step of providing the first opening portion in the first layer, the first opening portion being provided in the first layer so as to be overlapped with the second opening portion, when projected in the thickness direction.

According to the method for producing a suspension board with circuit, the third layer includes the second conductor circuit and the third conductor circuit, and the first conductor circuit is electrically connected to the third conductor circuit via the connecting portion. Thus, the third conductor circuit that is electrically connected to the first conductor circuit can be provided at the one side in the thickness direction of the first layer, so that the area of the first conductor circuit that is provided at the other side in the thickness direction of the first layer can be reduced. Therefore, the area of the first opening portion that is provided in the first layer made of the metal supporting board can be reduced, so that the strength of the first layer and accordingly, the strength of the suspension board with circuit can be improved. Also, the production efficiency can be improved.

According to the suspension board with circuit and the producing method thereof of the present invention, the thinning of the suspension board with circuit is possible, and the miniaturization and the electrically conductive properties of the conductor layer can be excellent.

BRIEF DESCRIPTION OF THE DRAWINGS

FIGS. 5A to 5G show process drawings for illustrating a method for producing the suspension board with circuit shown in FIG. 1:

FIG. 5A illustrating a step of preparing a metal supporting board,

FIG. 5B illustrating a step of forming a base insulating layer,

FIG. 5D illustrating a step of forming a cover insulating layer,

FIG. 5E illustrating a step of processing the metal supporting board,

FIG. 5F illustrating a step of forming a lower-side conductor pattern, and

FIG. 5G illustrating a step of mounting a slider unit.

FIG. 6 shows a bottom view of a second embodiment (embodiment in which light emitting element-connecting circuits are formed below a base insulating layer) of a suspension board with circuit of the present invention.

FIG. 8 shows an enlarged sectional view of a modified example (embodiment in which a signal terminal serves as a double-sided terminal via a terminal connecting portion) of the first embodiment of the suspension board with circuit of the present invention.

FIG. 9 shows an enlarged sectional view of a modified example (embodiment in which a signal terminal serves as a double-sided terminal) of the first embodiment of the suspension board with circuit of the present invention.

DETAILED DESCRIPTION OF THE INVENTION

Figure 1:
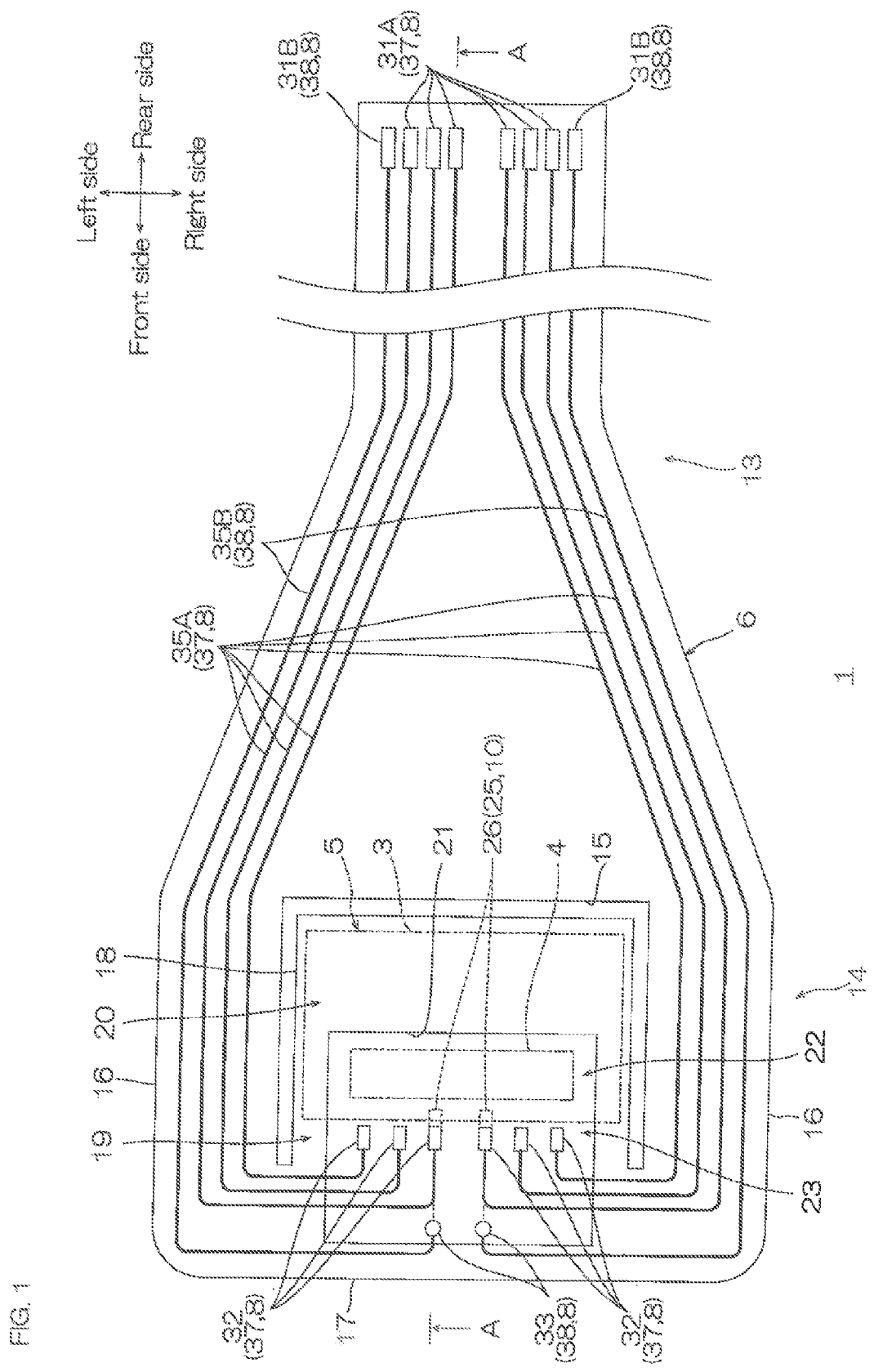
FIG. 1 shows a plan view (a base insulating layer is omitted) of a first embodiment of a suspension board with circuit of the present invention.

In FIG. 1, the right-left direction of the paper surface is referred to as a front-rear direction (first direction), the left side of the paper surface Is referred to as a front side (one side in the first direction), and the right side of the paper surface is referred to as a rear side (the other side In the first direction). The up-down direction of the paper surface is referred to as a right-left direction (widthwise direction, second direction), the upper side of the paper surface is referred to as a left side (one side In the widthwise direction, one side in the second direction), and the lower side of the paper surface is referred to as a right side (the other side in the widthwise direction, the other side in the second direction). The paper thickness direction of the paper surface is referred to as an up-down direction (thickness direction, third direction), the near side of the paper surface is referred to as an upper side (one side in the thickness direction, one side in the third direction), and the far side of the paper surface is referred to as a lower side (the other side in the thickness direction, the other side in the third direction). To be specific, directions are In accordance with direction arrows in each view, in FIG. 1, a base insulating layer 7 and a cover insulating layer 9 are omitted and in FIGS. 2 to 3, the cover insulating layer 9 is omitted.

<First Embodiment>

A suspension board with circuit 1 shown in FIG. 1 is mounted with a slider 3 mounted with a magnetic head 2 as one example of a second electronic component and a slider unit 5 mounted with a light emitting element 4 as one example of a first electronic component. The suspension board with circuit 1 is to be mounted on a hard disk drive (not shown) using a heat assist method.

Figure 2:
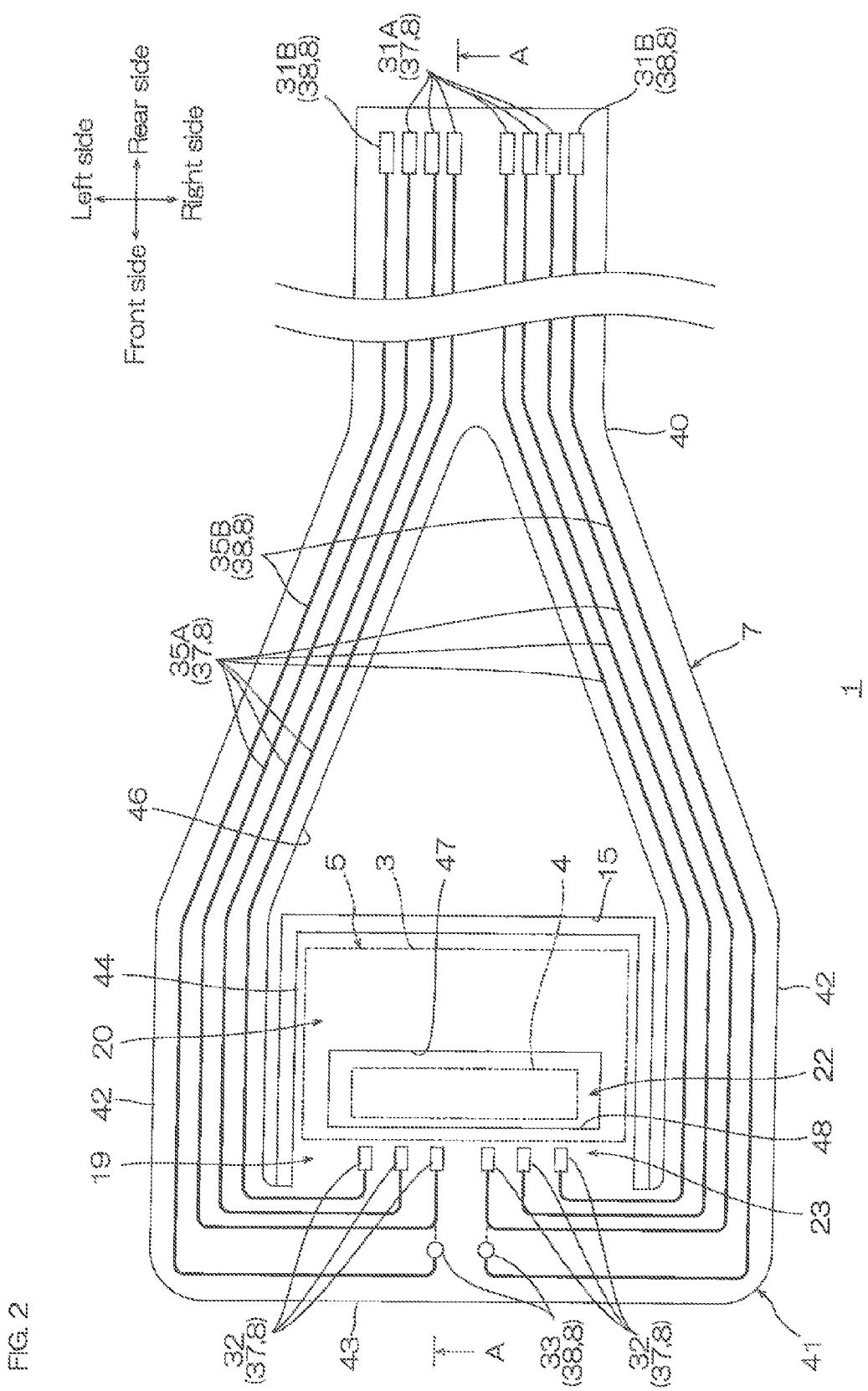
FIG. 2 shows a plan view (a base insulating layer is shown) of the first embodiment of the suspension board with circuit shown in FIG. 1.
Figure 3:
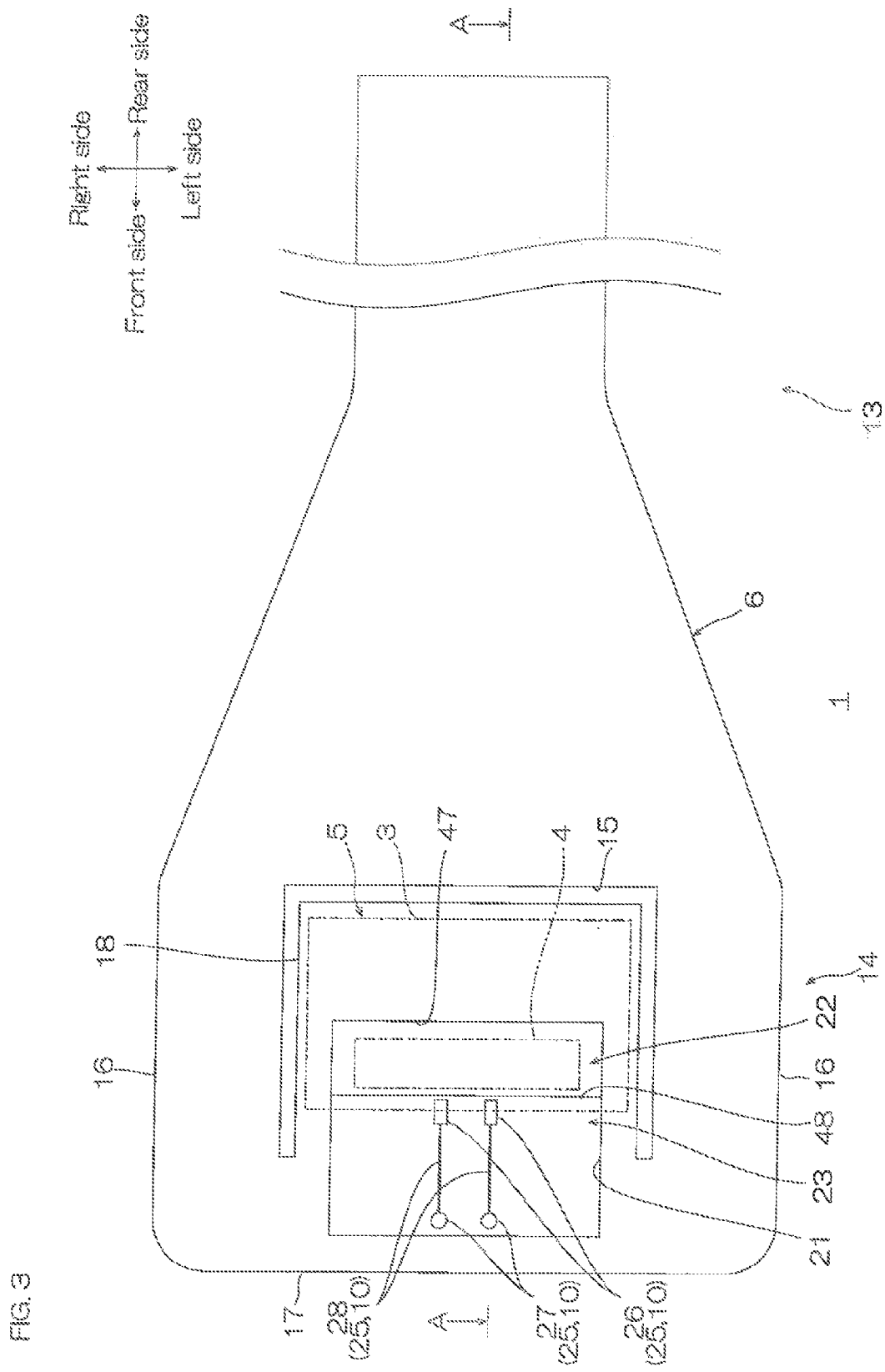
FIG. 3 shows a bottom view of the suspension board with, circuit shown in FIG. 1.
Figure 4:
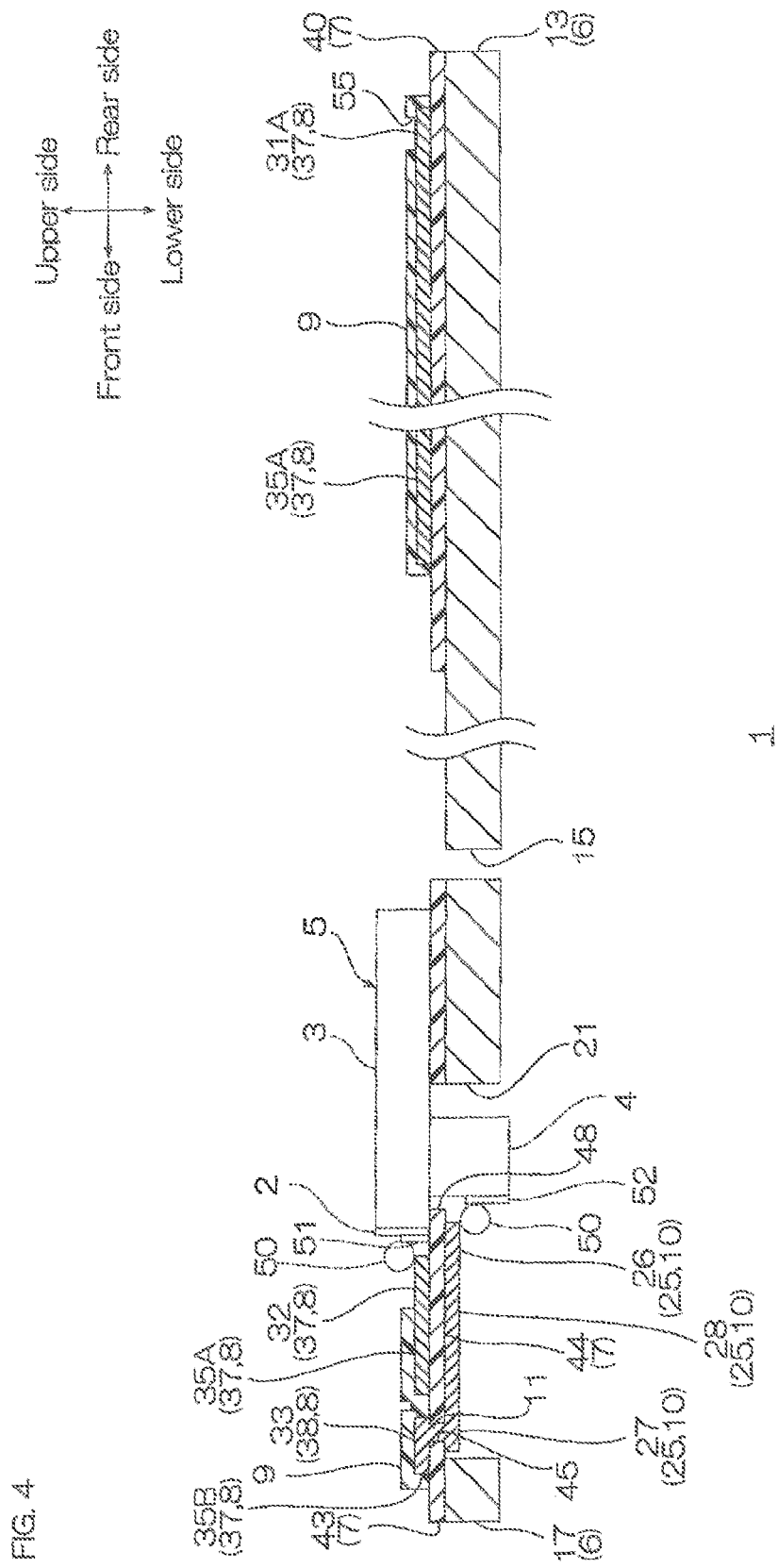
FIG. 4 shows an enlarged sectional view along an A-A line of the suspension board with circuit shown in FIG. 1.

As shown in FIGS. 1 to 3, the suspension board with circuit 1 has a flat belt shape extending in the front-rear direction. As shown in FIG. 4, the suspension board with circuit 1 includes a metal supporting board 6 as one example of a first layer, the base insulating layer 7 that is provided on the metal supporting board 6 as one example of a second layer, an upper-side conductor pattern 8 that is provided on the base insulating layer 7 as one example of a third layer, a lower-side conductor pattern 10 that is provided below the base insulating layer 7 as one example of a conductor layer, electrically conductive connecting portions 11 as one example of a connecting portion, and the cover insulating layer 9 that is provided on the upper-side conductor pattern 8.

As shown in FIG. 1, the metal supporting hoard 6 has a flat belt shape extending in the front-rear direction, and integrally includes a main body portion 13 and a gimbal portion 14 that is formed at the front side of the main body portion 13.

The main body portion 13 has a generally rectangular shape in plane view extending in the front-rear direction and is formed so as to expand in the widthwise direction at the front-side portion. The main body portion 13 is supported by a load beam (not shown) of a hard disk drive, when the suspension board with circuit 1 is mounted on the hard disk drive.

When the main body portion 13 is mounted on the load beam, the gimbal portion 14 is not mounted on the load beam, the lower surface thereof is exposed from the load beam, and the slider unit 5 (ref: phantom lines) is mounted thereon. The gimbal portion 14 has a generally rectangular shape in plane view that extends continuously from the front end of the main body portion 13 forwardly and is wider than the main body portion 13. The gimbal portion 14 includes one pair of outrigger portions 16, a wire folded back portion 17, and a mounting portion 18.

The outrigger portions 16 have slender rectangular shapes in plane view and are formed as one pair so as to extend in linear shapes from both end portions in the widthwise direction of the main body portion 13 forwardly.

The wire folded back portion 17 has a generally rectangular shape in plane view extending in the widthwise direction so as to be disposed between the front end portions of the one pair of outrigger portions 16.

The mounting portion 18 has a generally rectangular shape in plane view extending from the rear end of the center in the widthwise direction of the wire folded back portion 17 rearwardly. The mounting portion 18 is disposed at spaced intervals to the inner sides in the widthwise direction of the one pair of outrigger portions 16 and at spaced intervals to fee front side with respect to the front end edge of the main body portion 13. In this manner, a rear-side opening portion 15 in a generally U-shape having an opening forwardly in plane view is formed between the mounting portion 18 and the one pair of outrigger portions 16, and between the mounting portion 18 and the main body portion 13.

The mounting portion. 18 is a slider mounting region in which the slider unit 5 is mounted. The front-end portion thereof is defined as a slider connecting terminal -mounting portion 19 and the rear side with respect to the front-end portion (that is, the central portion and the rear-side portion in the front-rear direction) thereof is defined as a slider mounting portion 20.

In the wire folded back, portion 17 and the mounting portion 18, as one example of a first opening portion, a font-side opening portion 21 that has an opening over the wire folded, back portion 17 and the mounting portion 18 is formed. To be specific, the front-side opening portion 21 is formed at the cental rear side in the widthwise direction of the wire folded back portion 17 and at the central front side in the widthwise direction of the mounting portion 18.

The front-side opening portion 21 has a generally rectangular shape in plane view so as to pass through the metal supporting board 6 in the thickness direction.

The metal supporting board 6 is, for example, formed of a metal material such as stainless steel, 42-alloy, and aluminum. Preferably, the metal supporting board 6 is formed of stainless steel.

The metal supporting board 6 has a thickness of, for example, 5 μm or more, or preferably 10 μm or more, and, for example, 35 μm or less, or preferably 30 μm or less.

As referred to FIGS. 2 and 4, the base insulating layer 7 is formed on the upper surface (surface at one side in the thickness direction) of fee metal supporting board 6. To be specific, the base insulating layer 7 includes a main body portion insulating layer 40 corresponding to the main body portion 13 and a gimbal portion insulating layer 41 corresponding to the gimbal portion 14.

As shown in FIG. 2, the main body portion insulating layer 40 has a generally Y-shape in plane view that extends from the rear end portion forwardly so as to correspond to the pattern in which the upper-side conductor pattern 8 (described later) is formed in the main body portion 13 and branches off toward obliquely both outer front sides in the widthwise direction at the front end portion of the main body portion 13.

The gimbal portion insulating layer 41 includes one pair of gimbal outer-side insulating layers 42 corresponding to the one pair of outrigger portions 16, a gimbal front-side insulating layer 43 corresponding to the wire folded back portion 17, and a gimbal inner-side insulating layer 44 corresponding to the mounting portion 18.

The one pair of gimbal outer-side insulating layers 42 have generally rectangular shapes in plane view so as to extend, continuously from the front end portion of the main body portion, insulating layer 40 forwardly at spaced Intervals thereto in the widthwise direction.

The gimbal front-side insulating layer 43 has a generally rectangular shape in plane view extending In the widthwise direction so as to be disposed between the front end portions of the one pair of gimbal outer-side insulating layers 42. The gimbal front-side insulating layer 43 is disposed so that the front end edge and the outer-side end edge thereof coincide with the front end edge and the outer-side end edge of the wire folded back portion 17 of the metal supporting board 6, respectively. The gimbal front-side insulating layer 43 is disposed, so as traverse the front-side opening portion 21 in the widthwise direction. That is, the gimbal front-side insulating layer 43 is provided, so as to cover the upper side of the front-side opening portion 21 in the wire folded back portion 17.

As shown, in FIG. 4, as one example of a second opening portion, a plurality (two pieces) of communicating holes 45 are formed in the gimbal front-side insulating layer 43.

The communicating holes 45 have, when projected in the thickness direction, generally circular shapes in plane view so as to pass through the gimbal front-side insulating layer 43 in the thickness direction at a portion overlapped with the front-side opening portion 21. To be specific, the one pair of communicating holes 45 are formed at spaced intervals to each other in the widthwise direction at the front-side portion, of the central portion in the widthwise direction of the front-side opening portion 21.

As shown in FIG. 2, the gimbal inner-side insulating layer 44 has a generally rectangular shape in plane view extending from the rear end edge of the center in the widthwise direction of fee gimbal front-side insulating layer 43 rearwardly. The gimbal inner-side insulating layer 44 is disposed so that the rear end edge and the outer-side end edge thereof coincide with the rear end edge and the outer-side end edge of the mounting portion 18, respectively.

A base opening portion 47 is formed at generally the central portion of the gimbal inner-side insulating layer 44. To be specific, the base opening portion 47 is provided at the center in the widthwise direction of the gimbal inner-side insulating layer 44 and at the front side with respect to the center in the front-rear direction. The base opening portion 47 has a generally rectangular shape in plane view extending in the widthwise direction so as to pass through the base insulating layer 7 in fee thickness direction. The base opening portion 47 is, when projected in the thickness direction, disposed so feat the end edge In the widthwise direction and the rear end edge thereof coincide with the end edge in the width wise direction and the rear end edge of the front-side opening portion 21, respectively. The front end edge of the base opening portion 47 is, when projected in the thickness direction, positioned at the cental portion in the front-rear direction of the front-side opening portion 21. That is, the base opening portion 47 is, when projected in the thickness direction, disposed so as to be overlapped with the rear-side portion of the front-side opening portion 21.

In the gimbal inner-side insulating layer 44, the base opening portion 47 is defined as a light emitting element-inserting region 22 and the front-side portion with respect to the base opening portion 47 is defined as a terminal forming region 23.

In the gimbal portion, insulating layer 41, a gimbal opening portion 46 in a generally V-shape having an opening forwardly in plane view is formed between the gimbal inner-side insulating layer 44 and the one pair of gimbal outer-side insulating layers 42, and between the gimbal inner-side insulating layer 44 and the main body portion insulating layer 40. The gimbal opening portion 46 is, when projected in the thickness direction, disposed so as to Include the rear-side opening portion 15.

The base insulating layer 7 is, for example, formed of an Insulating material such as a synthetic resin. Examples of the synthetic resin include polyimide resin, polyamide imide resin, acrylic resin, polyether nitrile resin, polyether sulfone resin, polyethylene terephthalate resin, polyethylene naphthalate resin, and polyvinyl chloride resin. Preferably, the base insulating layer 7 is formed of polyimide resin.

The base insulating layer 7 has a thickness (maximum thickness) of for example, 1 μm or more, or preferably 3 μm or more, and, for example, 35 μm or less, or preferably 33 μm or less.

The communicating hole 45 has a diameter of, for example, 5 μm or more, or preferably 10 μm or more, and, for example, 100 μm or less, or preferably 90 μm or less.

As referred, to FIGS. 1, 2, and 4, the upper-side conductor pattern 8 is formed on the upper surface of the base insulating layer 7. To be specific, the upper-side conductor pattern 8 includes head connecting circuits 37 as one example of a second conductor circuit and light emitting element-connecting circuits 38 as one example of a third conductor circuit.

As shown is FIGS. 1 and 2, the head connecting circuits 37 include signal terminals 31A, bead connecting terminals 32 as one example of a second electronic component-connecting terminal, and signal wires 35A.

A plurality (six pieces) of signal terminals 31A are provided at the rear end portion and generally the central portion in the widthwise direction of the main body portion insulating layer 40 and disposed at spaced intervals to each other in the widthwise direction. The signal terminals 31A, as external terminals, are electrically connected to a read/write board (not shown).

A plurality (six pieces) of head connecting terminals 32 are formed at the center in the widthwise direction at the front-end portion of the gimbal inner-side insulating layer 44 so as to be overlapped with the terminal forming region 23, when projected in the thickness direction, and disposed at spaced intervals to each other in the widthwise direction.

A plurality (six pieces) of signal wires 35A are formed in the main body portion insulating layer 40 at spaced intervals to each other in the widthwise direction and electrically connected to the signal terminals 31A and the head connecting terminals 32. The signal wires 35A transmit an electrical signal between the magnetic head 2 (ref: fee phantom lines) and the read/write board (not shown).

To be specific, the signal wires 35A are formed so as to extend from the signal terminals 31A forwardly in the main body portion insulating layer 40 and bend, in a branching state in two bundles toward both, sides in the widthwise direction along the main body portion insulating layer 40 in the front end portion of the main body portion insulating layer 40. Thereafter, the signal wires 35A bend forwardly in both, end portions in the widthwise direction and extend forwardly along the gimbal outer-side insulating layers 42 toward the front end portion of the gimbal portion insulating layer 41. As shown in FIG. 2, in the gimbal front-side insulating layer 43, the signal wires 35A bend toward inwardly in the widthwise direction to reach a converged state and are folded back to finally reach the head connecting terminals 32.

The light emitting element-connecting circuits 38 include power source terminals 31B, upper-side connecting terminals 33, and power source wires 35B.

A plurality (two pieces) of power source terminals 31B are provided at the rear end portion of the main body portion insulating layer 40. The power source terminals 31B are disposed at both outer sides in the width wise direction of the plurality (six pieces) of signal terminals 31A with one piece thereof at spaced intervals to the other piece thereof. The power source terminals 31B, as external terminals, are electrically connected to a power source (not shown).

A plurality (two pieces) of upper-side connecting terminals 33 are formed at the center in the widthwise direction at generally the center in the front-rear direction of the gimbal front-side insulating layer 43 so as to be overlapped with the front end portion of the front-side opening portion 21, when projected in the thickness direction, and disposed at spaced intervals to each other in the widthwise direction. The upper-side connecting terminals 33 have generally circular shapes (round Sand shapes) in plane view and are, when projected. In the thickness direction, disposed so as to include the communicating holes 45. As shown in FIG. 4, the lower end portions of the upper-side connecting terminals 33 are continuous to the upper end portions of the electrically conductive connecting portions 11 (described later).

As shown in FIG. 1, a plurality (two pieces) of power source wires 35B are provided and formed at both outer sides in the widthwise direction with respect to the plurality (six pieces) of signal wires 35A with one piece thereof at spaced intervals to the other piece thereof in the widthwise direction. To be specific, as shown in FIG. 1, the power source wires 35B are formed so as to extend from the power source terminals 31B forwardly along the signal wires 35A in the main body portion insulating layer 40 and the gimbal outer-side insulating layers 42. Then, in the gimbal front-side insulating layer 43, the power source wires 35B bend inwardly in the widthwise direction to be thereafter folded back rearwardly to finally reach the upper-side connecting terminals 33.

The power source wires 35B are electrically connected to the power source terminals 31B and the upper-side connecting terminals 33. The power source wires 35B supply electric power from the power source (not shown) to the light emitting element 4 (ref: the phantom lines).

As referred to FIGS. 3 and 4, the lower-side conductor pattern 10 is formed on the lower surface (surface at the other side in the thickness direction) of the base insulating layer 7. The lower-side conductor pattern 10 includes first conductor circuits 25.

As shown in FIG. 3, the first conductor circuits 25 are, when projected in the thickness direction, provided so as to be included in the front-side opening portion 21, As shown in FIG. 4, the first conductor circuits 25 are, when projected in a direction orthogonal to the thickness direction (plane direction), provided so as to be overlapped with the metal supporting board 6. To be more specific, the first conductor circuits 25 are, when projected In the plane direction, disposed so that the upper ends thereof coincide with the upper end of the metal supporting board 6 and the lower ends thereof are positioned at the upper side with respect to the lower end of the metal supporting board 6.

As shown in FIGS. 3 and 4, the first conductor circuits 25 include light emitting element-connecting terminals 26 as one example of a first electronic component-connecting terminal, lower-side connecting terminals 27, and lower-side wires 28.

A plurality (two pieces) of light emitting element-connecting terminals 26 are formed at the center in the widthwise direction in the front-end portion of the gimbal inner-side insulating layer 44 so as to be overlapped with the terminal forming region 23, when projected in the thickness direction, and disposed at spaced intervals to each other in the widthwise direction. The light emitting element-connecting terminals 26 are, when projected in the thickness direction, disposed at slightly spaced intervals to a front end edge 48 of the base opening portion 47 so that the front end edges thereof are positioned at the front side with respect to the front end edges of the head, connecting terminals 32.

The lower-side connecting terminals 27 are formed so as to correspond to the upper-side connecting terminals 33. That is, a plurality (two pieces) of lower-side connecting terminals 27 are formed at the center in the widthwise direction at generally the center in the front-rear direction of the gimbal front-side insulating layer 43 so as to be overlapped with the front end portion of the front-side opening portion 21, when projected in the thickness direction, and disposed at spaced intervals to each other in the widthwise direction. The lower-side connecting terminals 27 have generally circular shapes (round land shapes) In plane view and are, when projected in the thickness direction, disposed so as to be overlapped with the communicating holes 45 and the upper-side connecting terminals 33.

A plurality (two pieces) of lower-side wires 28 are provided. To be specific, the lower-side wires 28 are formed so as to extend is linear shapes from the light emitting element-connecting terminals 26 forwardly to the lower-side connecting terminals 27. The lower-side wires 28 are, when projected in the thickness direction, disposed so as to be overlapped with the signal wires 35A in the front-side opening portion 21. The lower-side wires 28 are electrically connected to the light emitting element-connecting terminals 26 and the lower-side connecting terminals 27.

As referred to FIG. 4, the electrically conductive connecting portions 11 are formed at the inside of the communicating holes 45. To be specific, the electrically conductive connecting portions 11 are disposed so as to fill the communicating holes 45. The electrically conductive connecting portions 11 have columnar shapes having smaller sizes than the upper-side connecting terminals 33.

The upper end portions of the electrically conductive connecting portions 11 are continuous to the lower surfaces of the upper-side connecting terminals 33, and the lower end portions of the electrically conductive connecting portions 11 are in contact with the upper surfaces of the lower-side connecting terminals 27. In this manner, the power source terminals 31B are electrically connected to the light emitting element-connecting terminals 26 via the power source wires 35B, the upper-side connecting terminals 33, the electrically conductive connecting portions 11, the lower-side connecting terminals 27, and the lower-side wires 28.

The upper-side conductor pattern 8, the lower-side conductor pattern 10, and the electrically conductive connecting portions 11 are formed of copper or a copper alloy, An example of the metal that forms copper and an alloy includes a conductor metal such as nickel, gold, and solder. Preferably, the upper-side conductor pattern 8, the lower-side conductor pattern 10, and the electrically conductive connecting portions 11 are formed of copper.

The upper-side conductor pattern 8 has a thickness of, for example, 1 μm or more, or preferably 3 μm or more, and, for example, 25 μm or less, or preferably 20 μm. or less.

The thickness of the lower-side conductor pattern 10 is thinner than that of the metal supporting board 6 and is, for example, the same as the thickness of the upper-side conductor pattern 8. To be specific, the lower-side conductor pattern 10 has a thickness of, for example, 1 μm or more, or preferably 3 μm or more, and, for example, 25 μm or less, or preferably 20 μm or less.

Each of the signal wire 35A and the power source wire 35B has a width of, for example, 5 μm or more, or preferably 8 μm or more, and, for example, 200 μm or less, or preferably 100 μm or less.

The lower-side wire 28 has a width of, for example, 5 μm or more, or preferably 8 μm or more, and, for example, 200 μm or less, or preferably 100 μm or less.

A gap between the plurality of signal wires 35A, a gap between the signal wire 35A and the power source wire 35B, and a gap between the plurality of lower-side wires 28 are, for example, 5 µm or more, or preferably 8 µm or more, and, for example, 1000 µm or less, or preferably 100 µm or less.

Each of the signal terminal 31A, the power source terminal 31B, the head connecting terminal 32, and the light emitting element-connecting terminal 26 has a width and a length (length in the front-rear direction) of, for example, 10 µm or more, or preferably 20 µm or more, and, for example, 1000 µm or less, or preferably 800 µm or less, A gap between the plurality of signal terminals 31A, a gap between the signal terminal 31A and the power source terminal 31B, and a gap between the plurality of head connecting terminals 32 are, for example, 10 µm or more, or preferably 20 µm or more, and, for example, 1000 µm or less, or preferably 800 µm or less.

Each of the upper-side connecting terminal 33 and the lower-side connecting terminal 27 has a diameter of for example, 30 µm or more, or preferably 40 µm or more, and, for example, 200 µm or less, or preferably 150 µm or less.

The diameter of the electrically conductive connecting portion 11 is the same as that of the communicating hole 45.

Although not shown, for example, a plating layer is provided on the surfaces of the signal terminals 31A, the power source terminals 31B, the head connecting terminals 32, and the light emitting element-connecting terminals 26 by plating such as electroless plating or electrolytic plating, or preferably by electrolytic plating. The plating layer is, for example, formed of a metal material such as nickel and gold. Preferably, the plating layer is formed of gold. The plating layer has a thickness of for example, 0.01 µm or more, or preferably 0.05 µm or more, and, for example, 8 µm or less, or preferably 4 µm or less.

As referred to FIG. 4, the cover insulating layer 9 is formed on the upper surface of the base insulating layer 7 over the main body portion 13 and the gimbal portion 14 so as to cover the upper-side conductor pattern 8.

The cover insulating layer 9 covers the signal wires 35A and the power source wires 35B and exposes the upper surfaces of the signal terminals 31A, the power source terminals 31B, and the head connecting terminals 32. To be specific, in the cover insulating layer 9, a signal terminal opening portion 55 that exposes the upper surfaces of the signal terminals 31A and a power source terminal opening portion (not shown) that exposes the upper surfaces of the power source terminal 31B are formed. In the mounting portion 18, the cover insulating layer 9 is formed so that the rear end edge thereof exposes the head connecting terminals 32. That is, the rear end edge in the mounting portion 18 of the cover insulating layer 9 is, in plane view, positioned at the front side with respect to the front end edge 48 of the base opening portion 47.

The cover insulating layer 9 is formed of the same insulating material as that of the base insulating layer 7. The cover insulating layer 9 has a thickness of, for example, 1 µm or more, or preferably 3 µm or more, and, for example, 40 µm or less, or preferably 10 µm or less.

Next, a method for producing the suspension hoard with circuit 1 and the mounting of the slider unit 5 are described, with reference to FIGS. 5A to 5G.

The suspension board with circuit 1 is produced by an Intermediate member preparing step of preparing an intermediate member 60, an opening step of providing the front-side opening portion 21 in the metal supporting board 6, and a first conductor circuit disposing step of providing the first conductor circuits 25 on the lower surface of the base insulating layer 7.

In the intermediate member preparing step, first, as shown in FIG. 5A, the metal supporting board 6 is prepared.

Next, as shown in FIG. 5B, the base insulating layer 7 is formed on the upper surface of the metal supporting board 6.

To be specific, as referred to FIG. 2, the base insulating layer 7 is formed on the metal supporting board 6 as a pattern corresponding to the main body portion insulating layer 40 and the gimbal portion insulating layer 41. In the gimbal portion insulating layer 41, the base insulating layer 7 is formed as a pattern including the base opening portion 47, the gimbal opening portion 46, and the communicating holes 45.

To form the base insulating layer 7 in which the base opening portion 47, the gimbal opening portion 46, and the communicating holes 45 are formed, a varnish of an insulating material having photosensitivity is applied onto the metal supporting board 6 to be then dried, thereby forming a base film.

Thereafter, the base film is exposed to light via a photomask that is not shown. The photomask includes a light shielding portion and a light felly transmitting portion. The light fully transmitting portion to a portion in which the base insulating layer 7 is formed, and the light shielding portion to a portion in which the base insulating layer 7 is not formed and portions in which the base opening portion 47, the gimbal opening portion 46, and the communicating holes 45 are formed are disposed in opposed, relation to the base film to be then exposed to light.

Thereafter, the base film is developed and is, if necessary, cured by heating, so that the base insulating layer 7 including the base opening portion 47, the gimbal opening portion 46, and tire communicating holes 45 is formed in tire above-described pattern.

Next, as shown in FIG. 5C, the upper-side conductor pattern 8 is formed on the upper surface of the base insulating layer 7 by a pattern forming method such as an additive method or a subtractive method, or preferably by an additive method.

That is, as referred to FIG. 1, the upper-side conductor pattern 8 is formed on the upper surface of the base insulating layer 7 so as to include the signal terminals 31A, the power source terminals 31B, the head connecting terminals 32, the upper-side connecting terminals 33, the signal wires 35A, and the power source wires 35B.

As for the upper-side connecting terminals 33, first, the electrically conductive connecting portions 11 fill the inside of the communicating holes 45 and next, the upper-side connecting terminals 33 are formed thereon. In this manner, the electrically conductive connecting portions 11 and the upper-side connecting terminals 33 are integrally formed.

Next as shown in FIG. 5D, the cover insulating layer 9 is formed on the upper surface of the base insulating layer 7 so as to cover the upper-side conductor pattern 8.

To be specific, the cover insulating layer 9 is formed over the metal supporting board 6 as a pattern covering the signal wires 35A and the power source wires 35B and exposing the upper surfaces of the signal terminals 31A, the power source terminals 31B, and the head connecting terminals 32. That is, the cover insulating layer 9 is formed as a pattern including the signal terminal opening portion 55 and the power source terminal opening portion (not shown) and in which the rear end edge thereof in the mounting portion 18 is positioned at the front side with respect to the front end edge of the base opening portion 47.

To form the cover insulating layer 9, a varnish of an insulating material having photosensitivity Is applied to be then dried, thereby forming a cover film in the same manner as the formation of the base insulating layer 7. Thereafter, the obtained cover film is exposed to light and subsequently, developed to be then cured by heating. In this manner, the cover Insulating layer 9 is formed in the above-described pattern.

In this manner, the intermediate member 60 is obtained. The intermediate member 60 includes the metal, supporting board 6, the base insulating layer 7 that is formed on the metal supporting board 6, the upper-side conductor pattern 8 that is formed on the base insulating layer 7, the cover insulating layer 9 that is formed on the upper-side conductor pattern 8, and the electrically conductive connecting portions 11 that are formed at the inside of the communicating holes 45.

Next in the opening step, as shown in FIG. 5E, the front-side opening portion 21 is provided in the metal supporting board 6 of the intermediate member 60. To be specific, the front-side opening portion 21 is, for example, formed by etching the metal supporting board 6 so as to fee overlapped with the communicating boles 45, when projected in the thickness direction. At this time, along with the formation, of the front-side opening portion 21, the formation of the rear-side opening portion 15 and the trimming of the metal supporting board 6 are simultaneously performed.

Next, as shown in FIG. 5F, in the first conductor circuit disposing step, the first conductor circuits 25 are provided on the lower surface of the base insulating layer 7.

To be specific, the first conductor circuits 25 are formed on the lower surface of fee base insulating layer 7 by a pattern forming method such as an additive method or a subtractive method, or preferably by an additive method.

That is, as referred to FIG. 3, the first conductor circuits 25 are formed on the lower surface of the base insulating layer 7 at the inside of the front-side opening portion 21 so as to include the light emitting element-connecting terminals 26, the lower-side connecting terminals 27, and the lower-side wires 28.

At this time, the lower-side connecting terminals 27 are formed so as to be in contact with the lower surfaces of the electrically conductive connecting portions 11. In this manner, the electrically conductive connecting portions 11 are electrically connected to the lower-side connecting terminals 27.

Subsequently, if necessary, after the first conductor circuit disposing step, a plating layer is provided on the surfaces of the power source terminals 31B, the head connecting terminals 32, and the light emitting element-connecting terminals 26 by using a known plating processing method.

In this manner, the suspension hoard with circuit 1 can be produced.

To obtain a slider unit-mounting suspension board with circuit 61, next, as referred to FIG. 5G, the slider unit 5 is mounted on the suspension board with circuit 1.

As shown in FIG. 5G, the slider unit 5 includes the glider 3 and the light emitting element 4.

The slider 3 has a generally rectangular box shape in plane view. The slider 3 is mounted with the magnetic head 2.

The magnetic head 2 is provided at the front end portion of the slider 3 and provided so as to be capable of reading and writing with respect to a magnetic disk that is not shown.

A first terminal 51 is formed on the front end surface of the lower portion of the magnetic head 2.

The light emitting element 4 has a generally rectangular shape in plane view having a smaller outer shape than the slider 3. The light emitting element 4 is, for example, a heat assist device including a laser diode and provided so as to be capable of heating a record surface of the magnetic disk that is not shown by a laser beam. The light emitting element 4 is provided on the lower surface at the center in the front-rear direction of the slider 3.

A second terminal 52 is formed on the lower-side portion of the front, end portion of the light emitting element 4.

The slider unit 5 is mounted on the suspension board with circuit 1 from above so that the light emitting element 4 is inserted into the light emitting element-inserting region 22.

Then, the lower surface of the front end portion of the slider 3 is brought into contact with tire upper surface of the front-side portion of the gimbal inner-side insulating layer 44 and the lower surface of the rear-side portion of the slider 3 is brought into contact wife the upper surface of the rear-side portion of the gimbal inner-side insulating layer 44, so that the slider 3 is disposed on the slider mounting portion 20. At this time, an adhesive layer (not shown) is provided between the slider 3 and the gimbal inner-side insulating layer 44 and in this way, the slider unit 5 is fixed to the suspension board with circuit 1.

Subsequently, solder balls 50 are provided between the first terminal 51 and the head connecting terminal 32, and between the second terminal 52 and the light emitting element-connecting terminal 26 to be thereafter subjected to reflow process.

In this manner, in the slider unit 5, the first terminal 51 of the slider 3 is electrically connected to the head connecting terminal 32 by the solder ball 50 that is subjected to the reflow process, and the second terminal 52 of the light emitting element 4 is electrically connected to the light emitting element-connecting terminal 26 by the solder ball 50 that is subjected to the reflow process.

In the suspension board with circuit 1, the first conductor circuits 25 including the light emitting element-connecting terminals 26, the lower-side connecting terminals 27, and the lower-side wires 28 are formed in the front-side opening portion 21 of the metal supporting board 6 so as to be overlapped with the metal supporting board 6, when projected in a direction, orthogonal to the thickness direction. In this manner, the thinning of the suspension board with circuit 1 can be achieved.

The thickness of the lower-side conductor pattern 10, in particular, is formed, to be thinner than that of the metal supporting board 6. Thus, when a plurality of suspension boards with circuit 1 are overlapped, the lower-side conductor pattern 10 of one suspension board with circuit 1 is not in contact with, the tipper surface of another suspension board with circuit 1, so that the occurrence of damage of the lower-side conductor pattern 10 can be suppressed.

Furthermore, the first conductor circuits 25 including the light emitting element-connecting terminals 26, the lower-side connecting terminals 27, and the lower-side wires 28 are not formed of the metal supporting board, but formed of copper or a copper alloy, so that the electrically conductive properties are excellent. The first conductor circuits 25 axe formed by a known formation method of a wire pattern such as an additive method, so that the miniaturization is possible.

The upper-side conductor pattern 8 includes the head connecting circuits 37 and the light emitting element-connecting circuits 38, and the first conductor circuits 25 are electrically connected to the light emitting element-connecting circuits 38 via the electrically conductive connecting portions 11. Thus, the light emitting element-connecting circuits 38 that are electrically connected to the first conductor circuits 25 can be formed at the upper side of the metal supporting board 6, so that the area of the first conductor circuits 25 that are formed at the lower side of the metal supporting board 6 can be reduced. Therefore, the area of the front-side opening portion 21 that is formed in the metal supporting board 6 can be reduced, so that the strength of the metal supporting board 6 and accordingly, the strength of the suspension board with circuit 1 are excellent. Also, the production efficiency is excellent.

Although not shown, a lower-side cover Insulating layer may be formed on the lower surface of the base insulating layer 7 so as to cover the surfaces (lower and side surfaces) of the lower-side wires 28.

<Second Embodiment>

A second embodiment of the suspension board with circuit 1 is described with reference to FIGS. 6 and 7. In the second embodiment, the same reference numerals are provided for members corresponding to each of those described in the above-described first embodiment, and their detailed description is omitted.

in FIGS. 1 to 4, the light emitting element-connecting circuits 38 are provided on the upper surface of the base insulating layer 7. Alternatively, for example, as shown in FIGS. 6 and 7, the light emitting element-connecting circuits 38 can be also provided on the lower surface of the base insulating layer 7.

In the second embodiment, circuit opening portions 58 are formed in the metal supporting board 6.

A plurality (two pieces) of circuit opening portions 58 are formed corresponding to the light emitting element-connecting circuits 38 so as to pass through the metal supporting board 6 in the thickness direction.

To be specific, the circuit opening portions 58 are formed so as to extend from the rear end portion of the main body portion 13 forwardly and bend in a branching state in two bundles toward both sides in the widthwise direction along the main body portion 13 at the front side of the main body portion 13. Thereafter, the circuit opening portions 58 bend forwardly in both end portions in the widthwise direction and extend forwardly along the outrigger portions 16 in the gimbal portion 14. The circuit opening portions 58 bend in an inward direction in the wire folded back portion 17 and extend inwardly toward the front-side opening portion 21 to finally reach the front end portion at the outer side in the widthwise direction of the front-side opening portion 21.

In the base insulating layer 7, a plurality (two pieces) of power source terminal opening portions 56 are formed in the rear end portion of the main body portion insulating layer 40.

The light emitting element-connecting circuits 38 are formed on. the lower surface of the base insulating layer 7. The light emitting element-connecting circuits 38 are, when projected in the thickness direction, disposed so as to be included in the circuit opening portions 58 and the front-side opening portion 21. The light emitting element-connecting circuits 38 are, when projected in a direction orthogonal to the thickness direction (plane direction), disposed so as to be overlapped with the metal supporting board 6. To be more specific, the light emitting element-connecting circuits 38 are, when projected in the plane direction, disposed so that the upper ends thereof coincide with the upper end of the metal supporting board 6 and the lower ends thereof are positioned at the upper side with respect to the lower end of the metal supporting board 6.

The light emitting element-connecting circuits 38 include the power source terminals 31B and the power source wires 35B.

A plurality (two pieces) of power source terminals 31B are provided at the rear end portion of the main body portion insulating layer 40 of the main body portion 13. The power source terminals 31B are, when projected in the thickness direction, disposed so as to be overlapped with the power source terminal opening portions 56. In this manner, a part of the upper surfaces of the power source terminals 31B is exposed.

The power source wires 35B are formed so as to extend from the power source terminals 31B forwardly along the circuit opening portions 58 to reach the rear end edges of the lower-side wires 28 at the inside of the front-side opening portion 21.

In this manner, the power source terminals 31B are electrically connected to the light emitting element-connecting terminals 26 via the power source wires 35B and the lower-side wires 28 at the lower side of the base insulating layer 7.

Although not shown, a lower-side cover insulating layer may be formed on the lower surface of the base insulating layer 7 so as to cover the surfaces (lower and side surfaces) of the lower-side wires 28 and the power source wires 35B.

Figure 7:
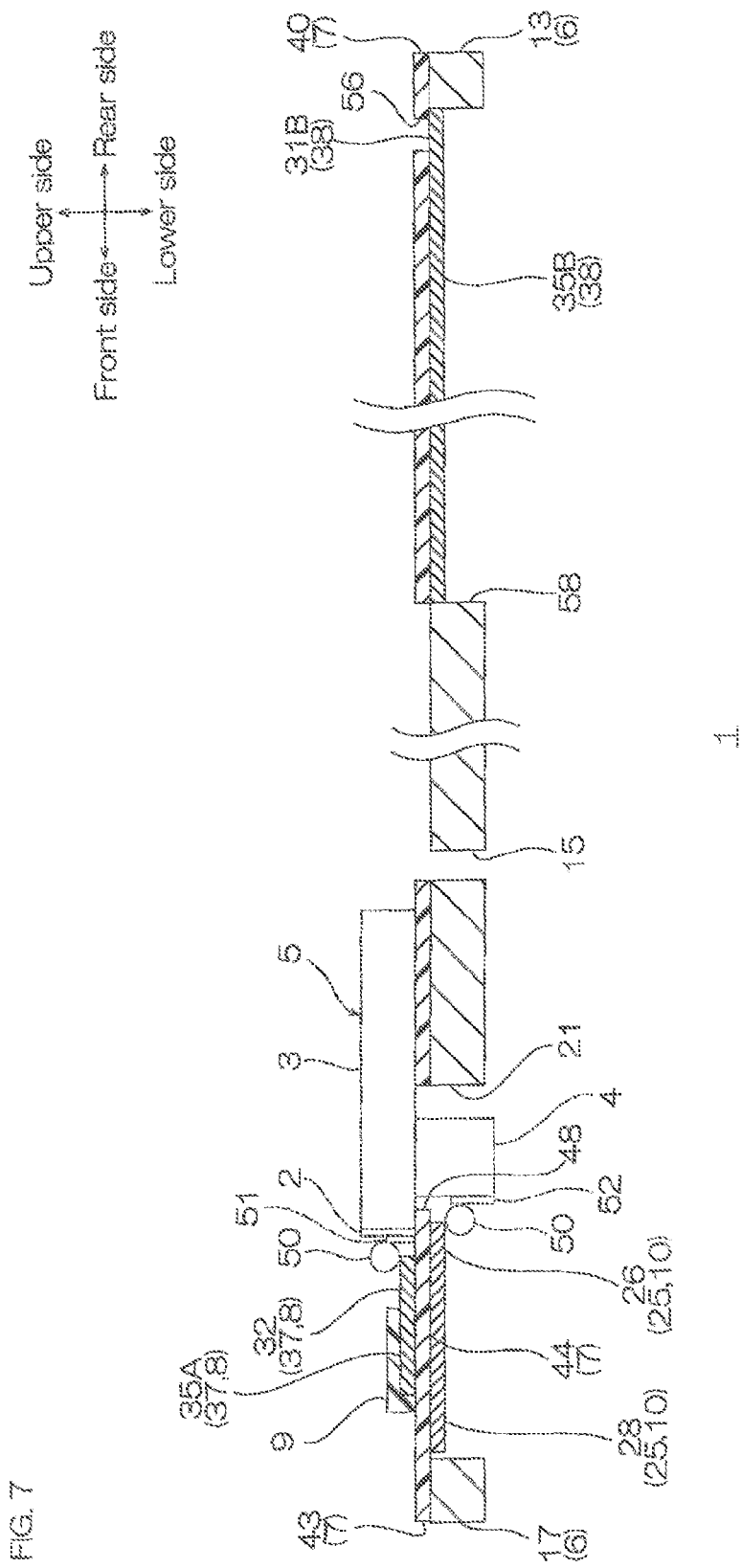
FIG. 7 shows an enlarged sectional view along a B-B line of the suspension board with circuit shown in FIG. 6.

In the embodiment in FIGS. 6 and 7, the same function and effect as that of the embodiment in FIG. 1 can be achieved. In the embodiment in FIGS. 6 and 7, the light emitting element-connecting circuits 38 are provided on the lower surface of the base insulating layer 7, so that a degree of freedom of wires is excellent. Also, the power source terminal opening portions 56 are formed in the base insulating layer 7 and the upper surfaces of the power source terminals 31B are exposed, so that a power source can be electrically connected thereto from above.

<Another Embodiments>

In the first embodiment as shown in FIG. 4, the signal terminals 31A are formed so that the upper surfaces thereof only are exposed and electrical conduction can be achieved from the upper surfaces thereof only. Alternatively, for example, as shown in FIG. 8, the signal terminals 31A can be also formed so that the electrical conduction can be achieved from the upper and lower surfaces.

In the embodiment in FIG. 8, a lower-side signal terminal opening portion 65 is formed in the metal supporting board 6.

The lower-side signal terminal opening portion 65 is formed, corresponding to the signal terminal opening portion 55 so as to pass through the metal supporting board 6 in the thickness direction. To be specific, the lower-side signal terminal opening portion 65 has generally the same shape as the signal terminal opening portion 55.

In the base insulating layer 7, a connection through hole 66 is formed. The connection through hole 66 has a generally circular shape in plane view at a position that is generally the center in plane view of the signal terminal 31A, when projected in the thickness direction, and passes thorough the base insulating layer 7 in the thickness direction. The connection through hole 66 is a small through hole whose hole size is sufficiently small compared to the length In one direction (length in the front-rear direction) of the signal terminal 31A.

The signal terminal 31A is formed of copper or a copper alloy and includes an upper-side signal terminal 67, a lower-side signal terminal 68, and a terminal connecting portion 69.

The upper-side signal terminal 67 has a generally rectangular shape in plane view on the upper surface of the base insulating layer 7 and the upper surface thereof is exposed from the signal terminal opening portion 55.

The lower-side signal terminal 68 has a generally rectangular shape in plane view on the lower surface of the base insulating layer 7. The lower-side signal terminal 68 is, when projected, in the thickness direction, disposed so as to be overlapped with the upper-side signal terminal 67 and so as to be included in the lower-side signal terminal opening portion 65. The lower-side signal terminal 68 is, when projected in the plane direction, disposed so as to be overlapped with the metal supporting board 6. To be more specific, the lower-side signal terminal 68 is, when projected in the plane direction, disposed so that the upper end thereof coincides with the upper end of the metal supporting board 6 and the lower end thereof is positioned at the upper side with respect, to the lower end of the metal supporting board 6.

Although not shown, a plating layer is provided on the surfaces (lower and side surfaces) of the lower-side signal terminal 68.

The terminal connecting portion. 69 is formed at the inside of the connection through hole 66. The upper end of the terminal connecting portion 69 is continuous to the lower surface of the upper-side signal terminal 67, and the lower end portion thereof is in contact with the upper surface of the lower-side signal terminal 68. In this manner, the upper-side signal terminal 67 is electrically connected to tie lower-side signal terminal 68 via tire terminal connecting portion 69.

In the embodiment in FIG. 8, the signal terminal ears serve as a double-sided, terminal, Also, a layer structure of the upper-side signal terminal 67 and the lower-side signal terminal 68 is included, so that the strength of the double-sided terminal is improved.

In the embodiment in FIG. 8, the upper-side signal terminal 67 is electrically connected to the lower-side signal terminal 68 via the terminal connecting portion 69. Alternatively, for example, as shown in FIG. 9, the upper-side signal terminal 67 can be also directly electrically connected to the lower-side signal terminal 68.

In the embodiment in FIG. 9, a terminal base opening portion 70 is formed in the base insulating layer 7.

The terminal, base opening portion 70 is, when projected in the thickness direction, provided so as to be included in the signal terminal 31A and has a generally rectangular shape in plane view that is slightly smaller than the signal terminal 31A.

The signal terminal 31A is formed of copper or a copper alloy and includes the upper-side signal terminal 67 and the lower-side signal terminal 68.

The upper-side signal terminal 67 integrally includes an upper-side signal terminal outer-side portion 67A that is provided on the upper surface of the circumferential end portion of the terminal base opening portion 70 and an upper-side signal terminal inner-side portion 67B that is positioned at the inner side of the upper-side signal terminal outer-side portion 67A and fills the inside of the terminal base opening portion 70. That is, the upper-side signal terminal 67 is formed so that generally the inner-side portion, thereof is dented downwardly. The lower surface of the upper-side signal terminal 67 coincides with the lower surface of the base insulating layer 7 in the plane direction.

The lower-side signal terminal 68 integrally includes a lower-side signal terminal outer circumferential portion 68A that is provided on the lower surface of the circumferential end portion of the terminal base opening portion 70 and a lower-side signal terminal inner-side portion 68B that is positioned at the inner side of the lower-side signal terminal outer circumferential portion 68A and provided on the lower surface of the upper-side signal terminal inner-side portion 67B.

In the embodiment in FIG. 9, the lower surface of the upper-side signal terminal 67 is in contact with the upper surface of the lower-side signal terminal 68. In this manner, the upper-side signal terminal 67 is electrically connected to the lower-side signal terminal 68.

In the embodiment in FIG. 9, the same function and effect as that of the embodiment in FIG. 8 can be achieved.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A suspension board with circuit comprising:
a first layer made of a metal supporting board, a second layer having insulating properties and provided at one side in a thickness direction of the first layer, and a third layer provided at one side in the thickness direction of the second layer and made of copper or a copper alloy, wherein
the first layer includes a first opening portion passing through in the thickness direction;
the first opening portion is provided with a conductor layer that is, when projected in a direction orthogonal to the thickness direction, overlapped with the first layer;
the conductor layer includes a first conductor circuit having a first electronic component-connecting terminal for being electrically connected to a first electronic component and made of copper or a copper alloy;
the third layer includes a second conductor circuit having a second electronic component-connecting terminal for being electrically connected to a second electronic component;
the third layer further includes a third conductor circuit;
the second layer includes a second opening portion passing through in the thickness direction so as to be overlapped with the first opening portion, when projected in the thickness direction; and
the second opening portion is provided with a connecting portion electrically connecting the first conductor circuit to the third conductor circuit.

2. The suspension board with circuit according to claim 1, wherein the first electronic component and the second electronic component are distinct components.

3. A suspension board with circuit comprising:
a first layer made of a metal supporting board, a second layer having insulating properties and provided at one side in a thickness direction of the first layer, and a third layer provided at one side in the thickness direction of the second layer and made of copper or a copper alloy, wherein
the first layer includes a first opening portion passing through in the thickness direction;
the first opening portion is provided with a conductor layer that is, when projected in a direction orthogonal to the thickness direction, overlapped with the first layer;
the conductor layer includes a first conductor circuit having a first electronic component-connecting terminal for being electrically connected to a first electronic component and made of copper or a copper alloy;
the third layer includes a second conductor circuit having a second electronic component-connecting terminal for being electrically connected to a second electronic component; and the first electronic component is a light-emitting element and the second electronic component is a magnetic head.

4. A suspension board with circuit comprising:
a first layer made of a metal supporting board, a second layer having insulating properties and provided at one side in a thickness direction of the first layer, and a third layer provided at one side in the thickness direction of the second layer and made of copper or a copper alloy, wherein
the first layer includes a first opening portion passing through in the thickness direction;
the first opening portion is provided with a conductor layer that is, when projected in a direction orthogonal to the thickness direction, overlapped with the first layer;
the conductor layer includes a first conductor circuit having a first electronic component-connecting terminal for being electrically connected to a first electronic component and made of copper or a copper alloy;
the third layer includes a second conductor circuit having a second electronic component-connecting terminal for being electrically connected to a second electronic component; and
the first opening portion comprises an opening which overlaps with the first electronic component and the second electronic component in the thickness direction.

5. A suspension board with circuit comprising:
a first layer made of a metal supporting board, a second layer having insulating properties and provided at one side in a thickness direction of the first layer, and a third layer provided at one side in the thickness direction of the second layer and made of copper or a copper alloy, wherein
the first layer includes a first opening portion passing through in the thickness direction;
the first opening portion is provided with a conductor layer that is, when projected in a direction orthogonal to the thickness direction, overlapped with the first layer;
the conductor layer includes a first conductor circuit having a first electronic component-connecting terminal for being electrically connected to a first electronic component and made of copper or a copper alloy;
the third layer includes a second conductor circuit having a second electronic component-connecting terminal for being electrically connected to a second electronic component; and
the first electronic component-connecting terminal overlaps with the first opening portion when projected in the thickness direction.

* * * * *